United States Patent [19]

Hawrylo

[11] Patent Number: 4,540,115
[45] Date of Patent: Sep. 10, 1985

[54] FLUX-FREE PHOTODETECTOR BONDING

[75] Inventor: Frank Z. Hawrylo, Hamilton Township, Mercer County, N.J.

[73] Assignee: RCA Corporation, Princeton, N.J.

[21] Appl. No.: 555,586

[22] Filed: Nov. 28, 1983

[30] Foreign Application Priority Data

Aug. 26, 1983 [GB] United Kingdom ............... 8323065

[51] Int. Cl.$^3$ ......................... H01L 21/58; B23K 1/04
[52] U.S. Cl. .................................. 228/123; 228/222; 228/228; 228/229
[58] Field of Search ............... 228/122, 123, 124, 228, 228/229, 200, 222

[56] References Cited

U.S. PATENT DOCUMENTS

| | | | |
|---|---|---|---|
| 3,071,854 | 1/1963 | Pighini | 228/200 X |
| 3,165,818 | 1/1965 | Soffa et al. | 228/123 X |
| 3,648,357 | 3/1972 | Green, Jr. | 228/238 X |
| 3,680,196 | 8/1972 | Leinkram | 228/123 |
| 3,883,946 | 5/1975 | Dale | 228/123 X |
| 4,039,116 | 8/1977 | Chaffin, III | 228/123 |
| 4,142,662 | 3/1979 | Holbrook et al. | 228/123 X |

FOREIGN PATENT DOCUMENTS 146153 1/1981 German Democratic Rep. ..................... 228/222

Primary Examiner—Kenneth J. Ramsey
Attorney, Agent, or Firm—Birgit E. Morris

[57] ABSTRACT

A method of bonding photodetector devices to heatsinks, which devices can be damaged above 250° C., using a gold-tin eutectic solder which has a melting point of 280° C., is disclosed. The process comprises heating the heatsink and solder past the solder melting point on a quick thermal response heating element, turning off the heating power, and introducing the chip into the liquid solder on the cool down cycle. By controlling the rate at which the heatsink solder and device cool down and the time span from introduction of the chip to solidification of the solder, the chip can be exposed to sufficient heat to provide a good thermal, electrical and physical bond while substantially enhancing the yield of electrically undamaged photodetector chips.

9 Claims, No Drawings

FLUX-FREE PHOTODETECTOR BONDING

This invention relates to a method of mounting semiconductor devices onto mounts or heatsinks and more particularly concerns a fluxless bonding method for mounting temperature and pressure-sensitive devices.

BACKGROUND OF THE INVENTION

Indium solder has been widely used in the semiconductor art for mounting semiconductor devices onto heatsinks. The low temperature (m.p. 156° C.) bond formed when soldering with indium is relatively soft causing very little stress to the mounted device. However Indium and other low temperature solders have the disadvantage that the limits of operating temperatures of the mounted devices will also be low and this is not acceptable for many current devices. These lower melting point solders are known to diffuse and creep at temperatures considerably below their melting points, weakening the bond strength and many times causing contamination to the device. Further, many solders, including indium, typically require the use of a flux for proper wetting, but the flux is a known source of contamination and is also thought to be responsible for voids in the bond which reduce the bond strength and can adversely affect the thermal and electrical properties of the bond.

Gold-tin eutectic alloy solders are also known for bonding semiconductor devices to heatsinks. Although gold-tin solders have the disadvantage that some stress may be introduced to the device during soldering, the advantages of gold-tin solders include higher operating temperatures, less contamination, better thermal and electrical conductivity and increased bond strength. A widely used and very desirable alloy from this group comprises 80 percent by weight of gold and 20 percent by weight of tin. This alloy has a melting point of 280° C.

One semiconductor device which would benefit considerably from the advantages of a 80Au20Sn bond is the InGaAs long wavelength photodetector. Most current applications for this and other semiconductor devices require a device-to-heatsink bond of the quality offered by a gold-tin eutectic alloy.

Unfortunately, when InGaAs dectectors are heated to 280° C. and above, as is necessary in bonding the device to the heatsink using 80Au20Sn, the detectors are adversely affected. In has been found that the leakage current which corresponds to the background noise of the device and is therefore a way of looking at the device integrity, increases to unsatisfactory levels when the device is exposed to temperatures of 250° C. and above. Thus, 250° C. is felt to be a critical temperature for InGaAs photodetectors.

The need to bond InGaAs detectors having a critical temperature of about 250° C. using a 280° C. m.p. solder, has led to attempts at employing thermocompression techniques. As is known in thermocompression bonding art, the parameters of temperature, pressure and time can be varied within certain limits to lower the bonding temperature required in a given process. For example, Dale in U.S. Pat. No. 3,883,946 disclosed bonding using temperatures 15° to 50° C. below the melting points of various solders by applying pressures between about 140 to 700 kg/cm$^2$ to the devices during bonding. Gold-tin, known to be a "hard" solder, necessitates higher pressures than those disclosed by Dale to lower the bonding temperature below the 250° C. critical point.

It has been found however that the InGaAs detectors cannot withstand pressures in this range for several reasons. First, the InGaAs device has a certain amount of inherent internal stress which is a function of the crystalline structure of the device. Further, the 80Au20Sn solder induces more stress after bonding because of the variations in the coefficient of expansion between the solder and the device. Finally, the addition of pressures in the range of 140 to 700 kg/cm$^2$ during bonding imparts amounts of stress which culminate in unacceptably short device lifetimes and unstable device operation.

For sensitive devices such as InGaAs photodetectors it would be desirable, therefore, to have a flux-free process to bond them to a heatsink using a higher temperature, corrosion resistant solder such as gold-tin, but without adversely affecting the detectors via high temperatures and/or pressures.

SUMMARY OF THE INVENTION

A method of bonding photodetector devices to heatsinks, which devices can be damaged above 250° C., using a gold-tin eutectic solder is disclosed. The process comprises heating the heatsink and solder above the solder melting point, turning off the heating power, and introducing the device into the liquid solder during the cooling. By controlling the rate at which the heatsink, solder and device cool, and the time span from introduction of the device into the solder to solidification of the solder, the device can be exposed to heat sufficient to provide a good thermal, electrical and physical bond while substantially enhancing the yield of mounted electrically undamaged photodetector devices. Further, the process obviates the need for a flux.

DETAILED DESCRIPTION OF THE INVENTION

The present process is based on introducing the device into the liquid solder as the solder is rapidly cooling so that the photodetector device is exposed to temperatures above 250° C. for only a very short time. Based on prior art techniques one skilled in the art would expect that if the device were introduced into a solder substantially hotter than the 250° C. critical temperature, that the device would be electrically damaged. Surprisingly however, it has been found that by controlling the cooling rate and time of temperature exposure of the device during bonding, a reproducible process which subjects the device to enough heat to produce a good bond, but not so much to adversely affect the device, is provided. Also, it has been found that the present bonding process can be carried out without the need for a flux.

To carry out this process the soldering can be done on a quick thermal response heating stage such as a 0.005" (0.012 cm) to 0.010" (0.025 cm) thick molybdenum or tantalum resistive filament. A heatsink is placed on the filament heating stage and the gold-tin solder is placed on the heatsink and wetted thereto. The heatsink is typically metallized copper, the final layer of metallization preferably being gold. The heating stage, heatsink and solder are heated to between 300°–310° C. (somewhat above the 280° C. melting point) so that upon introduction of the unheated device onto the solder a cold solder joint is avoided. Upon reaching 300°–310° C., the heat source is switched off and the device is put into the liquid solder at which point the solder is cooling. To minimize the amount of stress introduced into the device it has been found that about 1 micron of gold should be deposited onto the bonding surface of the device in addition to the state of the art metallizations.

The pressure on the device during bonding should be in the range of about 40–65 kg/cm$^2$. This pressure is applied by any convenient means. For example if using a die bonding machine, the vacuum collet which picks up the device and puts it into the solder typically has a pressure adjustment. Thus, in bonding a typical photodetector device measuring 0.020″×0.030″×0.010″ thick (0.051cm×0.076 cm×0.025 cm) a pressure between about 25 and 40 grams on the collet is suitable. This pressure is substantially lower than that used in thermocompression bonding and does not lower the temperature needed to provide a good bond, but rather is only that amount sufficient to provide good wetting and uniform heating. Mechanical scrubbing can also be used in the chip introduction step as is known in the thermocompression bonding art.

The most important factor in the present process is the amount of heat to which the device and solder are exposed. The parameters which define this amount of heat are the cooling rate and the time of exposure. According to the present invention the cooling rate is the rate at which the heating stage, heatsink, solder and device cool upon introduction of the device into the liquid solder. The time of exposure, for the purposes here, is the time span from the introduction of the device into the liquid solder to the point at which the solder solidifies. This time span was chosen because it is easy to measure. For example, when using 80Au20Sn solder the photodetector will be introduced into the liquid solder at about 300° C. and when the solder reaches about 280° C. it will solidify. The time span during which the device is exposed to this temperature range (300° C. to 280° C.) has been found to be a controlling parameter. It has been found that in bonding an InGaAs long wavelength photodetector which typically measures 0.020″×0.030″×0.010″, 20 seconds is an upper limit dictating that the heatsink, solder, and device be cooled at a rate of 1° C./second. A preferred time span, is about 10 seconds which means the heatsink, solder and device must be cooled at a rate of 2° C./second. If the system is cooled too rapidly during soldering for example, at a rate of 4° C./second the 5 second time span between 300° C. and solidification results in an unacceptable physical bond often referred to as a "cold" solder joint. It should be noted here that the cooling rates are dependent on the mass of the heating stage, heatsink and device. Therefore, for the purposes of the present invention, heating stages should be designed with regard to the known mass of the heatsinks and devices to be bonded. Cooling rates can be further increased by the use of a gas jet to blow an inert gas onto the bond after the device is introduced into the liquid solder.

All InGaAs detector devices exposed to temperatures above 250° C. for a few minutes, as per prior art gold-tin methods demonstrated, an unacceptable 2 to 5 times increase in leakage current, providing a zero percent yield. The process of the present invention provided a 55 percent yield.

It should be apparent that while the present invention has been described with respect to the mounting of InGaAs photodetectors using 80Au20Sn solder, other solders and devices could be employed in, and benefit from this process without departing from the scope of the concepts disclosed.

What is claimed is:

1. A method of soldering a semiconductor device to a heatsink wherein said device has a critical temperature above which it is adversely affected and wherein the solder has a melting temperature above said critical temperature, which method comprises;
    heating the heatsink and the solder above the solder melting point;
    cooling the liquid solder situate on the heatsink;
    introducing the device into the liquid solder under a pressure sufficient to provide uniform heating and wetting of the device by the solder; and
    controlling the time span and cooling rate between the device introduction step and the point at which the solder solidifies whereby an acceptable electrical and thermal bond of the device to the heatsink is provided with minimal adverse effects to the device.

2. The method of claim 1 wherein the solder comprises 80 percent by weight of gold and 20 percent by weight of tin.

3. The method of claim 2 wherein the solder is heated to a temperature about 20°–30° C. greater than its melting point.

4. The method of claim 3 wherein the solder is heated to a temperature of about 20°–30° C. greater than its melting point by applying the solder to the heatsink and heating them to said temperature together.

5. The method of claim 1 wherein the pressure applied to the device upon introduction of the device into the solder is between 40 and 64 kilograms per square centimeter.

6. The method of claim 5 wherein the cooling rate between the device introduction step and the point at which the solder solidifies is greater than about 1° C./second and wherein the time span between those two points is less than about 20 seconds.

7. The method of claim 6 wherein the cooling rate is less than about 4° C./second and wherein the time span is greater than about 5 seconds.

8. The method of claim 7 wherein the cooling rate is about 2° C./second and wherein the time span is about 10 seconds.

9. The method of claim 8 wherein the semiconductor device is a photodetector including InGaAs having a mounting surface with a gold pad thereon.

* * * * *

UNITED STATES PATENT AND TRADEMARK OFFICE
CERTIFICATE OF CORRECTION

PATENT NO. : 4,540,115

DATED : September 10, 1985

INVENTOR(S) : Frank Z. Hawrylo

It is certified that error appears in the above-identified patent and that said Letters Patent is hereby corrected as shown below:

Column 4, line 43, "64" should be --65--.

[SEAL]

Signed and Sealed this

Twenty-sixth Day of November 1985

Attest:

DONALD J. QUIGG

*Attesting Officer*

Commissioner of Patents and Trademarks